(12) United States Patent
Hirose

(10) Patent No.: US 12,532,406 B2
(45) Date of Patent: Jan. 20, 2026

(54) SURGE PROTECTION CIRCUIT AND SURGE PROTECTION METHOD

(71) Applicant: Mitsubishi Electric Corporation, Tokyo (JP)

(72) Inventor: Kenji Hirose, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 216 days.

(21) Appl. No.: 18/216,123

(22) Filed: Jun. 29, 2023

(65) Prior Publication Data

US 2023/0345628 A1    Oct. 26, 2023

Related U.S. Application Data

(63) Continuation of application No. PCT/JP2021/009713, filed on Mar. 11, 2021.

(51) Int. Cl.
*H02H 9/02* (2006.01)
*H05K 1/02* (2006.01)

(52) U.S. Cl.
CPC ............. *H05K 1/0263* (2013.01); *H02H 9/02* (2013.01)

(58) Field of Classification Search
CPC ........ H05K 1/02; H05K 1/0263; H05K 1/165; H05K 1/0259; H05K 7/14; H02H 9/02; H02H 9/06; H02H 1/00
USPC .................................................. 361/212, 220
See application file for complete search history.

(56) References Cited

U.S. PATENT DOCUMENTS

| 5,991,164 A | * | 11/1999 | Saito ........................ H01T 4/08 361/752 |
| 6,016,084 A | * | 1/2000 | Sugimoto ............ H03H 7/1758 361/818 |
| 7,778,040 B2 | * | 8/2010 | Ahn ........................ H05K 1/165 174/253 |
| 2010/0148796 A1 | * | 6/2010 | Feucht .................. H05K 1/0268 324/538 |
| 2011/0115495 A1 | * | 5/2011 | Kunii .................... H05K 1/0254 324/543 |
| 2011/0242721 A1 | * | 10/2011 | Chen ..................... H05K 1/0254 361/131 |

(Continued)

FOREIGN PATENT DOCUMENTS

JP        5-219648 A    8/1993

OTHER PUBLICATIONS

International Search Report (PCT/ISA/210) issued in PCT/JP2021/009713 mailed on Jun. 1, 2021.

*Primary Examiner* — Danny Nguyen
(74) *Attorney, Agent, or Firm* — BIRCH, STEWART, KOLASCH & BIRCH, LLP

(57) ABSTRACT

Disclosed is a surge protection circuit including a printed circuit board; a surge absorber disposed on the printed circuit board; a member having conductivity and magnetism, and extending in a direction orthogonal to a face of the printed circuit board; and a conductor wire having an end connected to the surge absorber and another end connected to the member, formed in such a way as to extend from a point of intersection between a plane parallel to the face of the printed circuit board and a center line of the member in the orthogonal direction, which is a start point, and formed along at least a part of a virtual spiral shape centered at the point of intersection on the parallel plane.

3 Claims, 10 Drawing Sheets

(56) References Cited

U.S. PATENT DOCUMENTS

2011/0292552 A1* 12/2011 Chen .................... H05K 1/0215
361/56
2017/0314606 A1* 11/2017 Le ........................ F16B 39/021

* cited by examiner

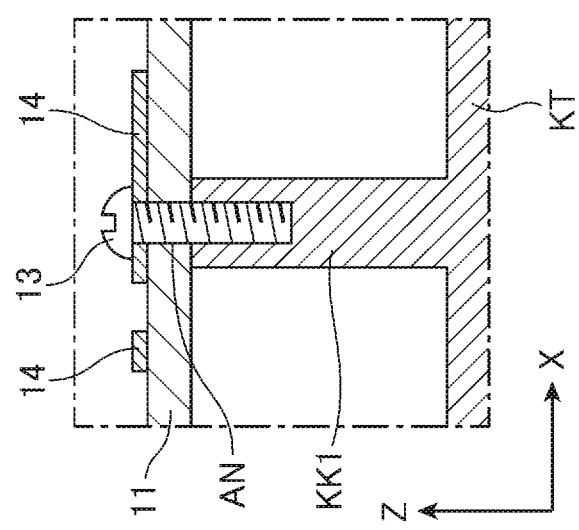
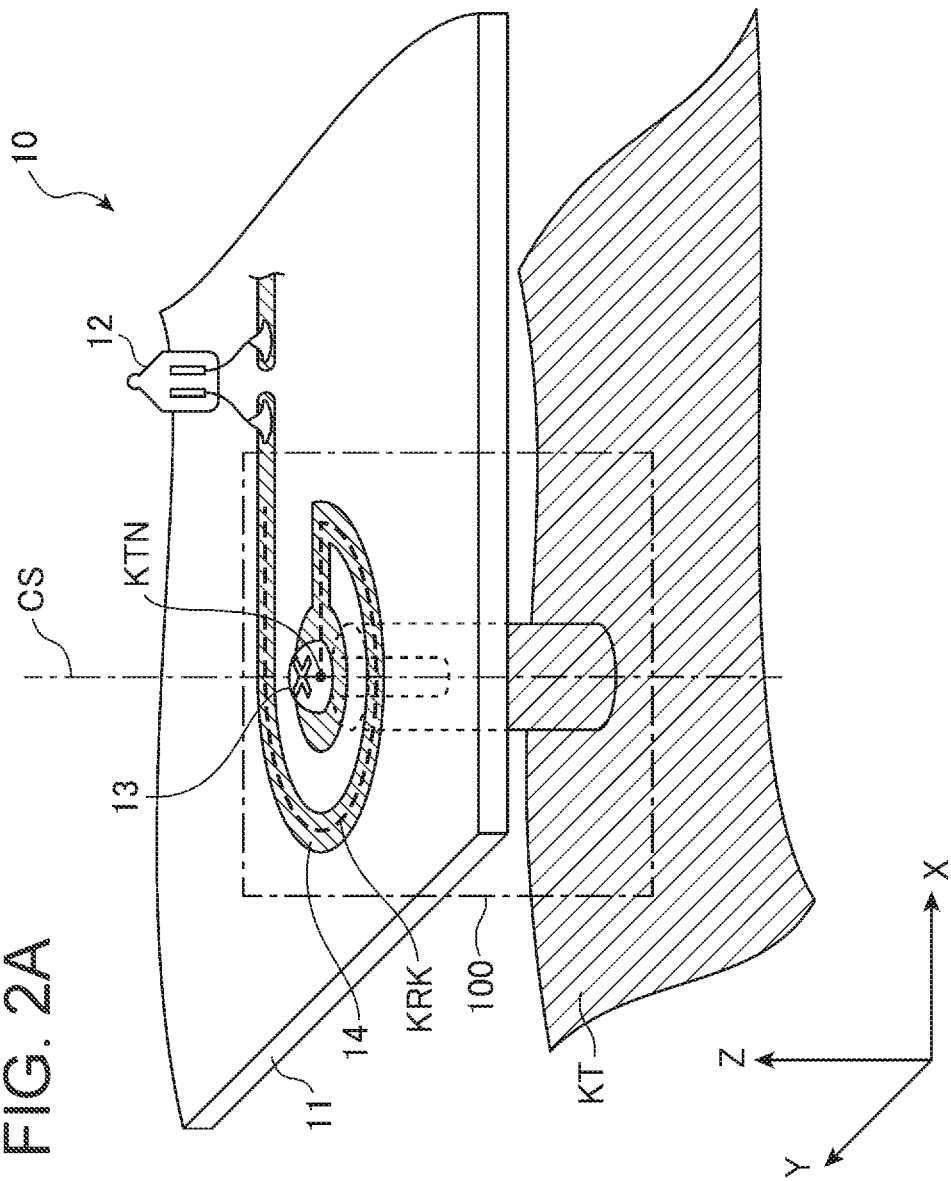
FIG. 2A
FIG. 2B

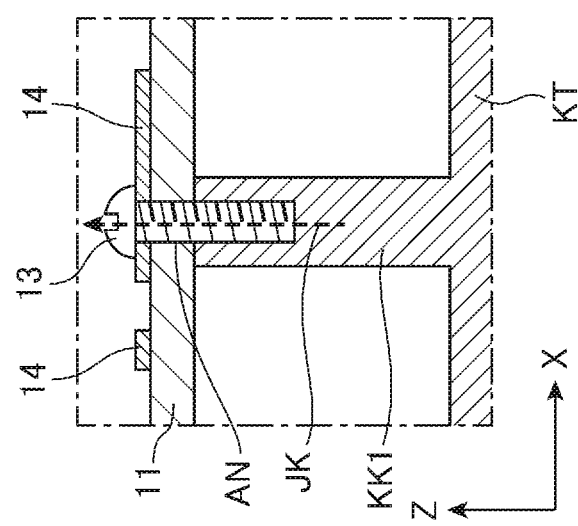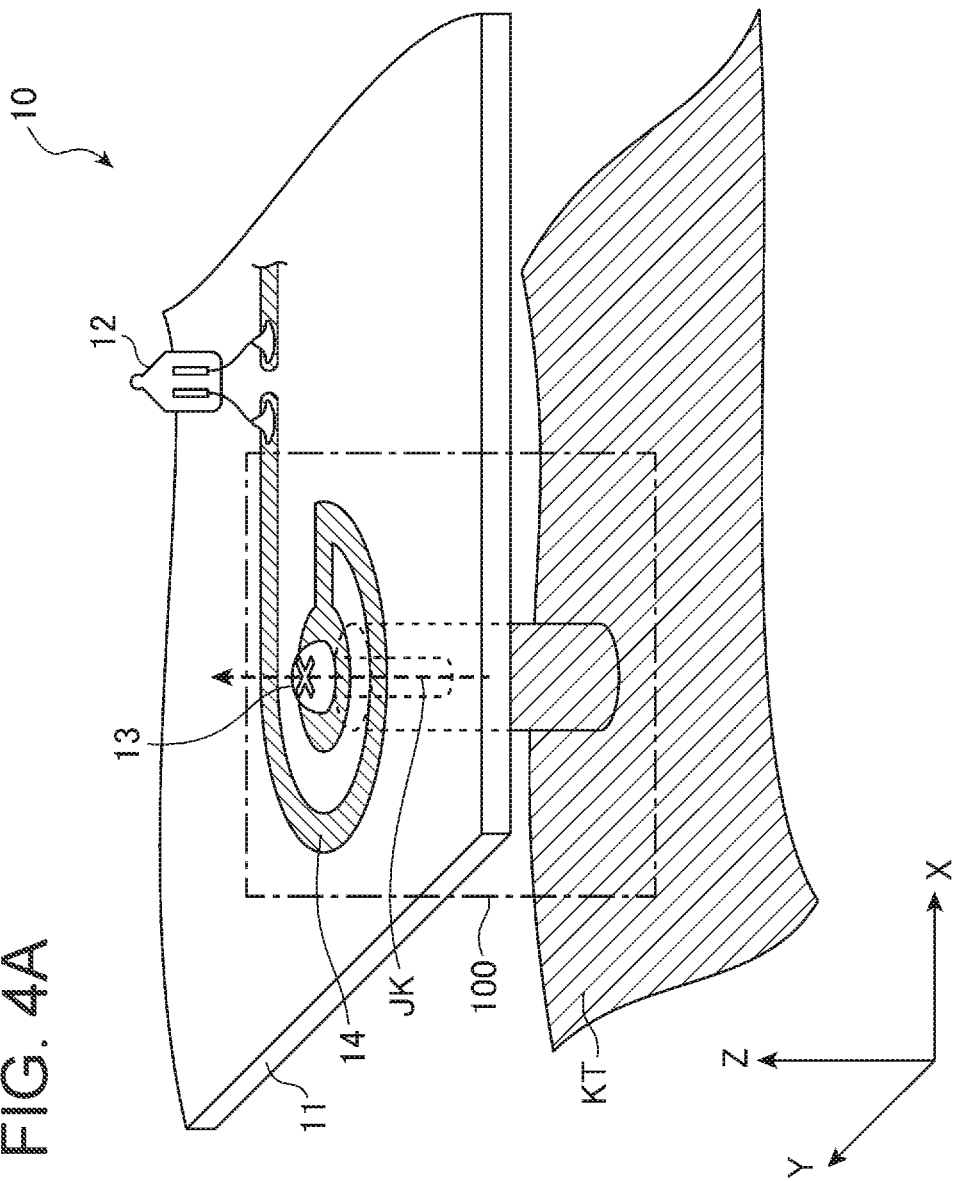

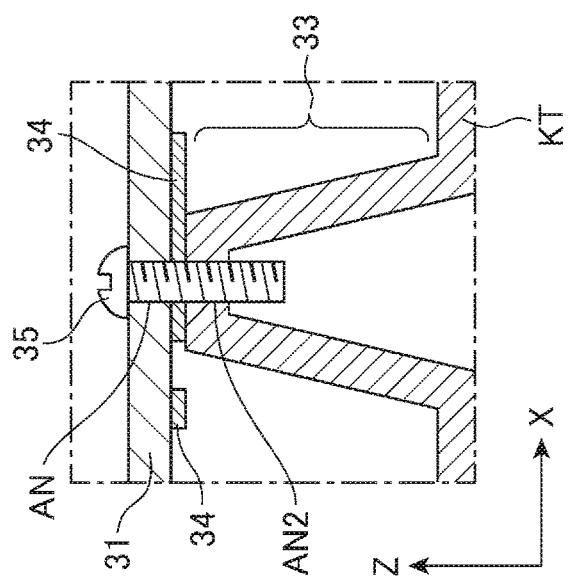
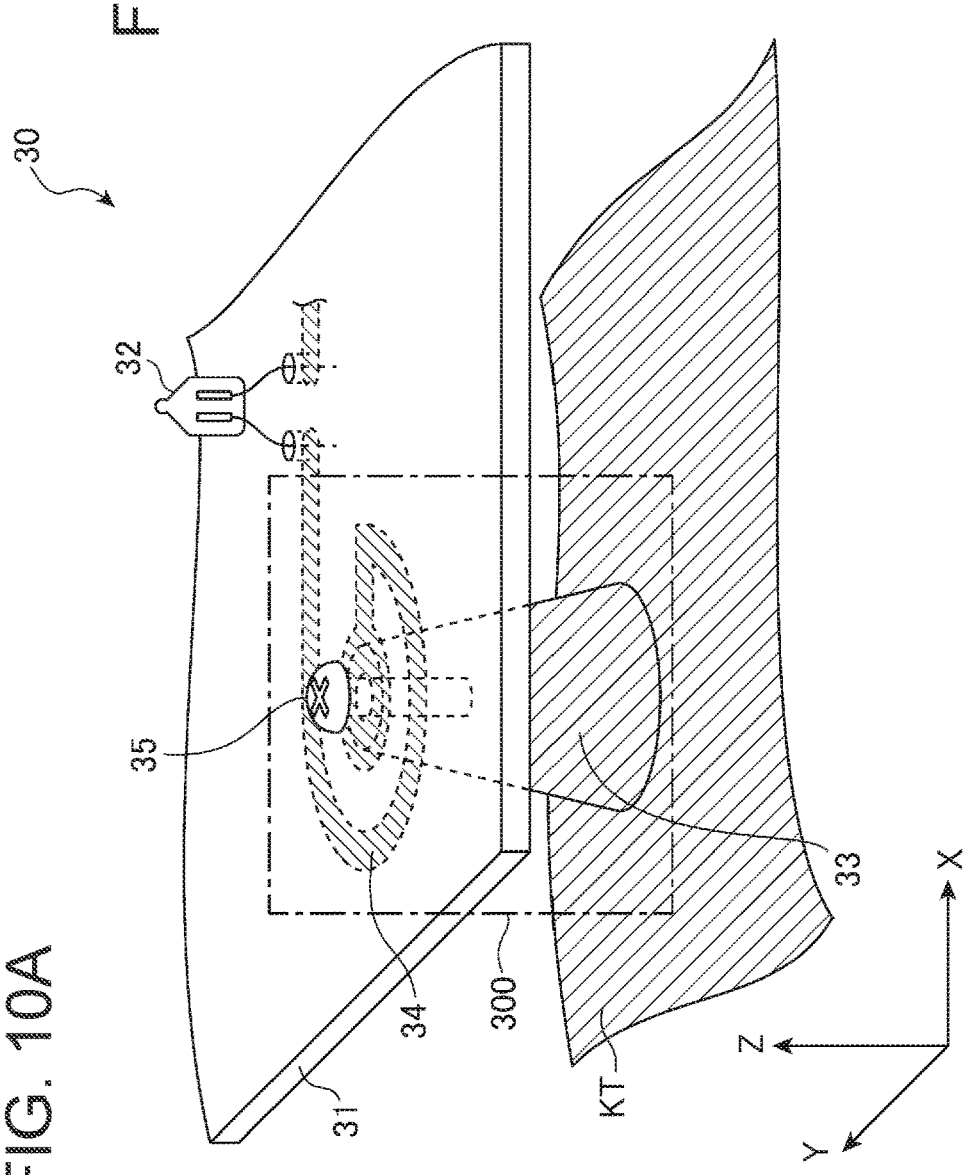
FIG. 10A
FIG. 10B

SURGE PROTECTION CIRCUIT AND SURGE PROTECTION METHOD

CROSS REFERENCE TO RELATED APPLICATIONS

This application is a Continuation of PCT International Application No. PCT/JP2021/009713, filed on Mar. 11, 2021, which is hereby expressly incorporated by reference into the present application.

TECHNICAL FIELD

The present disclosure relates to a surge protection circuit and a surge protection method.

BACKGROUND ART

A lightning protection device described in Patent Literature 1 which is an example of a surge protection circuit has a coil for protecting a semiconductor element for protecting a circuit and an element which are disposed in the lightning protection device from a lightning strike or the like from a rapid increase in a current, the rapid increase originating from the lightning strike or the like.

CITATION LIST

Patent Literature

Patent Literature 1: JP-A-Hei 05-219648

SUMMARY OF INVENTION

Technical Problem

However, for configuration reasons, the above-mentioned coil is very large compared with the sizes of the semiconductor element and so on mentioned above. Therefore, it is difficult to downsize the above-mentioned surge protection circuit.

It is an object of the present disclosure to provide a surge protection circuit which can be downsized easily.

Solution to Problem

To solve the above-mentioned problem, a surge protection circuit according to the present disclosure includes: a printed circuit board; a surge absorber disposed on the printed circuit board; a member having conductivity and magnetism, and extending in a direction orthogonal to a face of the printed circuit board; and a conductor wire having an end connected to the surge absorber and another end connected to the member, formed in such a way as to extend from a point of intersection between a plane parallel to the face of the printed circuit board and a center line of the member in the orthogonal direction, which is a start point, and formed along at least a part of a virtual spiral shape centered at the point of intersection on the parallel plane.

Advantageous Effects of Invention

The surge protection circuit according to the present disclosure can be downsized easily compared with surge protection circuits which employ a coil.

BRIEF DESCRIPTION OF DRAWINGS

FIG. 2A is a perspective view illustrating the configuration of the surge protection circuit 10 according to Embodiment 1, and FIG. 2B is a cross-sectional view illustrating the configuration of the surge protection circuit 10 according to Embodiment 1;

FIG. 4A is a perspective view illustrating a relation between a surge current SC and a magnetic field JK in Embodiment 1, and FIG. 4B is a cross-sectional view illustrating the relation between the surge current SC and the magnetic field JK in Embodiment 1;

FIG. 10A is a perspective view illustrating the configuration of a surge protection circuit 30 according to Embodiment 3, and FIG. 10B is a cross-sectional view illustrating the configuration of the surge protection circuit 30 according to Embodiment 3;

DESCRIPTION OF EMBODIMENTS

Embodiment 1

Embodiment 1

Embodiment 1 of a surge protection circuit according to the present disclosure will be explained.

Configuration of Embodiment 1

Figure 1:
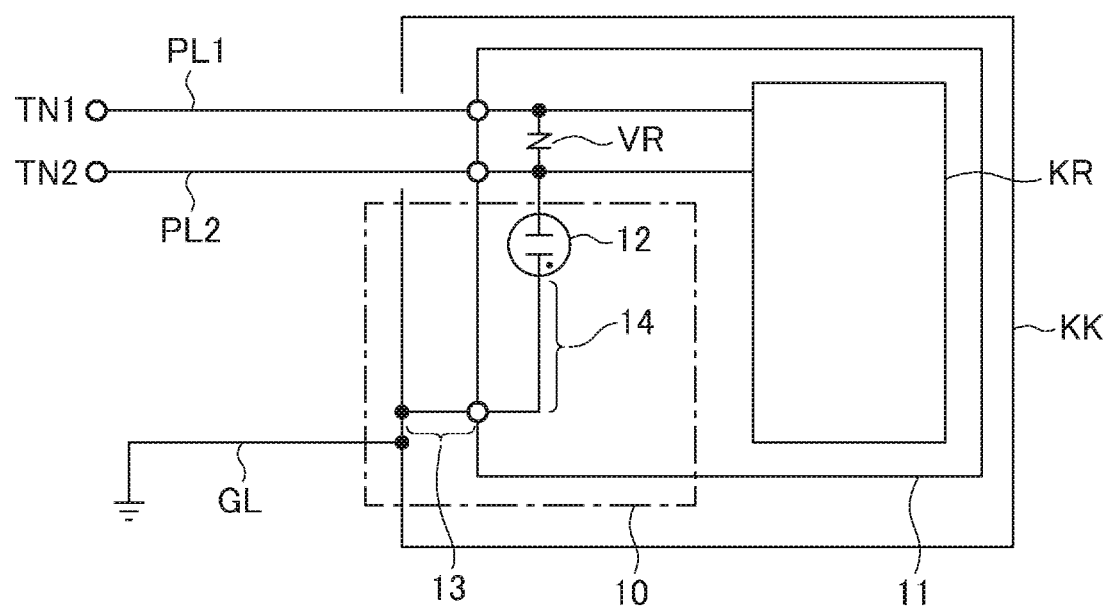
FIG. 1 is a circuit diagram of equipment including a surge protection circuit according to Embodiment 1.

FIG. 1 is a circuit diagram of equipment including the surge protection circuit according to Embodiment 1.

The equipment KK of Embodiment 1 includes a printed circuit board 11, as shown in FIG. 1. On the printed circuit board 11 are arranged a circuit KR which is an electric circuit, an electronic circuit and so on, and a varistor VR and a surge absorber 12 for protecting the circuit KR from lightning and so on. On the printed circuit board 11 is further formed a conductor wire 14. Between the printed circuit board 11 and a housing KT (illustrated in FIG. 2) of the equipment KK is placed a bar member 13.

The circuit KR receives the supply of power, e.g., the supply of a single-phase alternating voltage of 100V via a first terminal TN1 and a second terminal TN2, and a first power source wire PL1 and a second power source wire PL2. The varistor VR is connected between the first power source wire PL1 and the second power source wire PL2. The surge absorber 12, the conductor wire 14, and the bar member 13 are connected in series between the second power source wire PL2 and a grounding electric potential GL.

The equipment KK, more precisely, the housing KT (illustrated in FIG. 2) of the equipment KK is connected to the grounding electric potential GL.

A part of the printed circuit board 11, the surge absorber 12, the bar member 13 having a cylindrical shape, and the conductor wire 14 constitute the surge protection circuit 10.

FIG. 2A is a perspective view illustrating the configuration of the surge protection circuit 10 according to Embodiment 1.

FIG. 2B is a cross-sectional view illustrating the configuration of the surge protection circuit 10 according to Embodiment 1, taken along an XZ plane 100 of FIG. 2A.

The configuration of the surge protection circuit 10 according to Embodiment 1 will be explained by referring to FIGS. 2A and 2B.

The surge protection circuit 10 includes the printed circuit board 11, the surge absorber 12, the bar member 13, and the conductor wire 14, as shown in FIG. 2A.

The surge protection circuit 10 corresponds to a "surge protection circuit", the printed circuit board 11 corresponds to a "printed circuit board", the surge absorber 12 corresponds to a "surge absorber", the bar member 13 corresponds to a "member", and the conductor wire 14 corresponds to a "conductor wire."

The printed circuit board 11 is made from an insulating material, as conventionally known. On a front face (XY plane) of the printed circuit board 11 is disposed the surge absorber 12. On the front face of the printed circuit board 11, i.e., on an upper face of the printed circuit board 11 is formed the conductor wire 14. In the printed circuit board 11 is formed a hole AN for fixing the printed circuit board 11 to the equipment KK using the bar member 13, as shown in FIG. 2B.

The surge absorber 12 is, for example, an arrester with two terminals. The surge absorber 12 has a gap disposed between electrodes at both ends thereof, and causes a surge voltage originating from lightning or the like to discharge through the gap.

The bar member 13 is a screw made from a material having conductivity and magnetism. As the material, for example, iron or some kind of stainless steel having magnetism is provided. The bar member 13 extends in a direction (direction of a Z axis) orthogonal to the front face (XY plane) of the printed circuit board 11.

The conductor wire 14 has an end connected to the surge absorber 12 and another end connected to the bar member 13, as shown in FIG. 2A. In other words, the surge absorber 12, the conductor wire 14, and the bar member 13 are connected in series to one another. Further, the conductor wire 14 extends from a point of intersection KTN of the front face (XY plane) of the printed circuit board 11 with a center line CS of the bar member 13 in the above-mentioned orthogonal direction (direction of the Z axis), which is a start point, and is wired. Further, the conductor wire 14 is formed in such a way as to extend along at least a part of a virtual spiral shape KRK placed on the front face (XY plane) of the printed circuit board 11 and centered at the point of intersection KTN. In summary, the conductor wire 14 is formed in such a way as to surround the bar member 13.

The conductor wire 14 may start from the point of intersection KTN of, for example, a plane (XY plane) (not illustrated) which is parallel to the front face (XY plane) of the printed circuit board 11 and which is assumed to be in the printed circuit board 11, instead of the front face (XY plane) of the printed circuit board 11, and the center line CS of the bar member 13. In other words, the point of intersection KTN may be present in a layer of the printed circuit board 11, instead of being present on the front face of the printed circuit board 11.

The housing KT of the equipment KK is fundamentally made from a conductive material, e.g., metal. In the housing KT of the equipment KK, at least a part which should be at the grounding electric potential GL (illustrated in FIG. 1), e.g., a part KK1, as shown in FIG. 2B, between the bar member 13 and a ground (not illustrated) is made from a conductive material. The above-mentioned part KK1 is formed in a cylindrical shape extending in the above-mentioned orthogonal direction (direction of the Z axis).

The bar member 13 is screwed and fastened, via the above-mentioned printed hole AN of the circuit board 11, to the above-mentioned part KK1 of the housing KT of the equipment KK, as shown in FIG. 2B. As a result, the printed circuit board 11 and the housing KT of the equipment KK are mechanically fixed to each other. In addition to mechanically fixing the printed circuit board 11 and the equipment KK to each other, the bar member 13 electrically connects the conductor wire 14 on the printed circuit board 11 and the housing KT of the equipment KK.

"Parallel" and "vertical", which are mentioned above, do not necessarily mean that parallelism is strictly required and verticality is strictly required. As long as an inductance (mentioned later) increases even a little, strict parallelism is not required and strict verticality is not required.

Operation of Embodiment 1

Figure 3B:
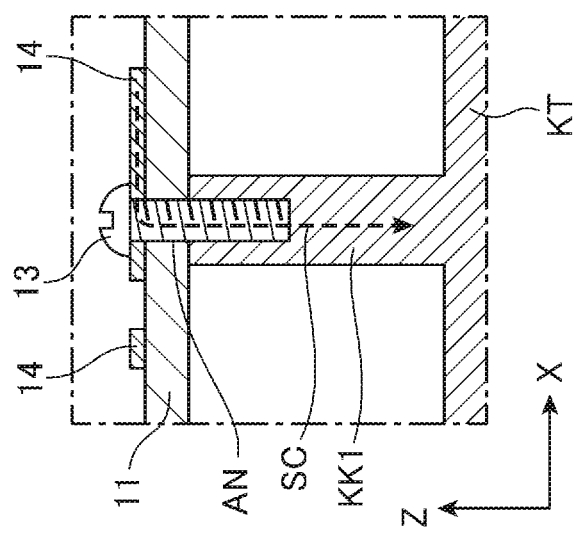
FIG. 3B is a cross-sectional view illustrating the operation of the surge protection circuit 10 according to Embodiment 1.
Figure 3A:
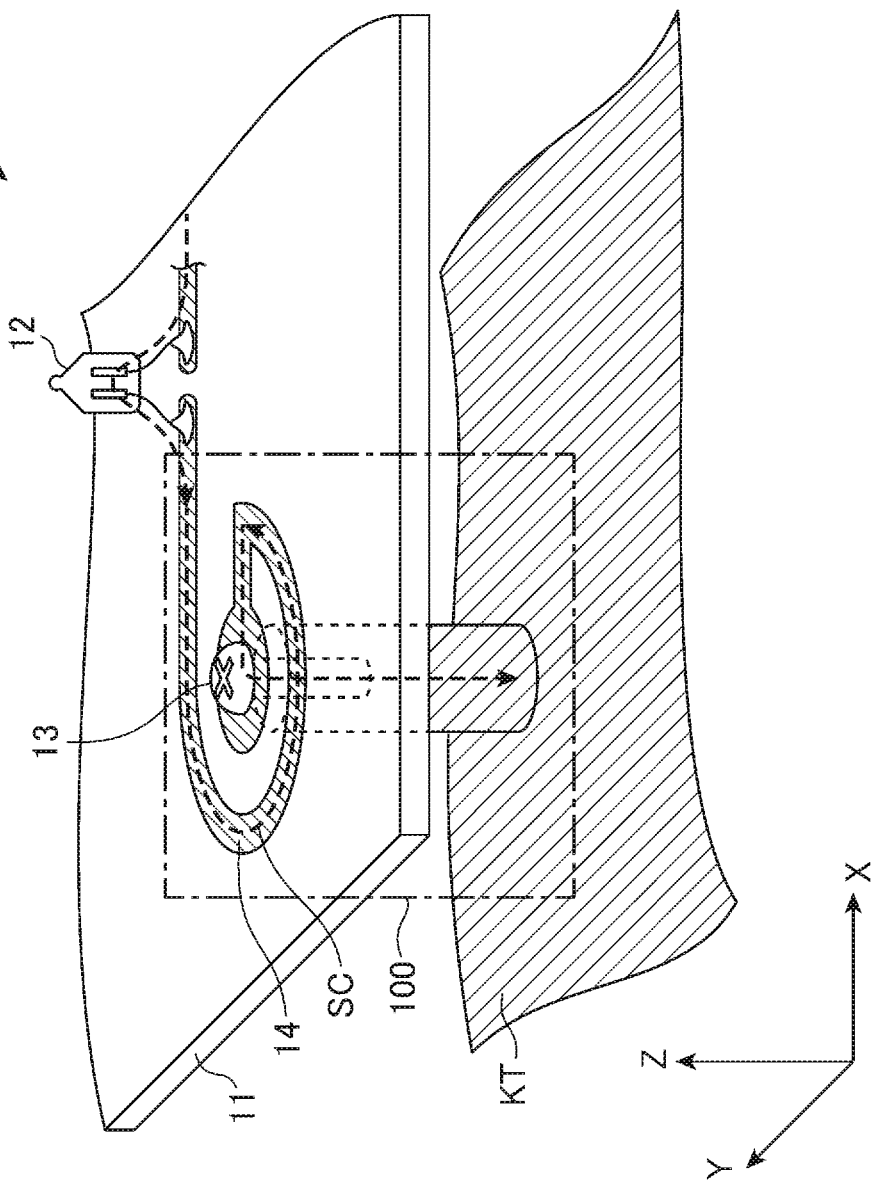
FIG. 3A is a perspective view illustrating the operation of the surge protection circuit 10 according to Embodiment 1.

FIG. 3A is a perspective view illustrating the operation of the surge protection circuit 10 according to Embodiment 1.

FIG. 3B is a cross-sectional view illustrating the operation of the surge protection circuit 10 according to Embodiment 1.

The operation of the surge protection circuit 10 according to Embodiment 1 will be explained by referring to FIGS. 3A and 3B.

When lightning or the like occurs, and a surge voltage (not illustrated) which is caused by the lightning or the like is applied to the equipment KK, the surge absorber 12 reacts to the surge voltage and a surge current SC flows as shown by dotted arrows in the surge protection circuit 10. Concretely, the surge current SC flows from the varistor VR (illustrated in FIG. 1), via the surge absorber 12, the conductor wire 14, and the bar member 13, into the housing KT of the equipment KK, as shown by the dotted arrows.

Advantageous Effect of Embodiment 1

FIG. 4A is a perspective view illustrating a relation between the surge current SC and a magnetic field JK in Embodiment 1.

FIG. 4B is a cross-sectional view illustrating the relation between the surge current SC and the magnetic field JK in Embodiment 1.

An advantageous effect of the surge protection circuit 10 according to Embodiment 1 will be explained by referring to FIGS. 4A and 4B.

When the surge current SC flows along the conductor wire 14, i.e., in the XY plane, as shown by the arrows in FIGS. 3A and 3B, the magnetic field JK passing through the inside and outside of the bar member 13 extending in the direction of the Z axis is caused according to the right hand cork screw rule, as shown by dotted arrows in FIGS. 4A and 4B. Because the bar member 13 has magnetism, and hence the above-mentioned magnetic field JK passes through the inside of the bar member 13, the inductance of the conductor wire 14 increases as compared with the case of having no bar member 13. As a result, a rapid variation of the surge current SC can be made to be gentle, i.e., can be prevented by the increased inductance of the conductor wire 14, like in the case of conventional surge protection circuits.

In the surge protection circuit 10 according to Embodiment 1, the adoption of the above-mentioned configuration of the conductor wire 14 of the bar member 13 eliminates the necessity to dispose a coil which requires space for placement above the printed circuit board 11, the space being large compared to the surge absorber 12 and so on. As a result, the surge protection circuit 10 according to Embodiment 1 can be downsized when compared to conventional surge protection circuits.

Comparison with a Comparative Example

Figure 5A:
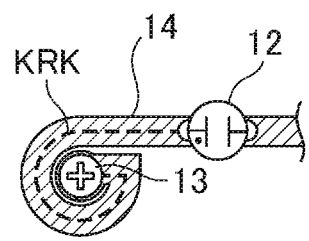
FIG. 5A is a view (view of the configuration according to Embodiment 1) illustrating a comparison between the surge protection circuit 10 according to Embodiment 1 and a surge protection circuit which is a comparative example.

FIG. 5A is a view (view of the configuration of Embodiment 1) illustrating a comparison between the surge protection circuit 10 of Embodiment 1 and a surge protection circuit which is an comparative example.

Figure 5B:
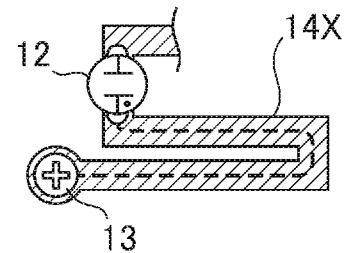
FIG. 5B is a view (view of the configuration of the comparative example) illustrating the comparison between the surge protection circuit 10 according to Embodiment 1 and the surge protection circuit which is the comparative example.

FIG. 5B is a view (view of the configuration of the comparative example) illustrating the comparison between the surge protection circuit 10 according to Embodiment 1 and the surge protection circuit which is the comparative example.

A comparison between an effect of the surge protection circuit 10 according to Embodiment 1 and an effect of the surge protection circuit which is the comparative example will be explained by referring to FIGS. 5A and 5B.

In the surge protection circuit 10 according to Embodiment 1 and in the surge protection circuit which is the comparative example, an iron screw whose relative permeability is greater than or equal to 1,000 is used as the bar member 13.

The surge protection circuit 10 according to Embodiment has an inductance equal to theoretically and approximately 30 nH because the conductor wire 14 is formed in such a way as to extend along the virtual spiral shape KRK in narrow space in the vicinity of the bar member 13.

In contrast with this, in the surge protection circuit which is the comparative example, a conductor wire 14X is formed of a straight wire and a folded wire, instead of being formed to extend along a virtual spiral shape KRK, so as to cause an inductance of approximately 30 nH, which is the same as the above-mentioned inductance.

The conductor wire 14X has a wire width of 3 mm and, typically, has 0.6 nH/mm. As a result, the total length of the conductor wire 14X (the length of an alternate long and short dash line in FIG. 5B) should be approximately 50 mm. It is therefore said that the space for forming the conductor wire 14 in the surge protection circuit 10 according to Embodiment 1 is small compared to the space for forming the conductor wire 14X in the surge protection circuit which is the comparative example.

<Variant>
<Variant of the Conductor Wire 14>

Figure 6:
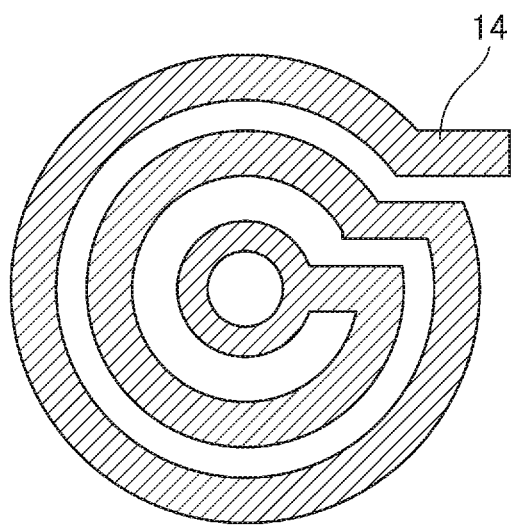
FIG. 6 shows Variant 1 of a conductor wire 14.

FIG. 6 shows Variant 1 of the conductor wire 14.

The conductor wire 14 may be wound several times such as two times, instead of being wound only once (illustrated in FIG. 2A). Because of this, the inductance of the conductor wire 14 can be further increased, and, as a result, a rapid variation of the surge current SC can be prevented more strongly.

Figure 7A:
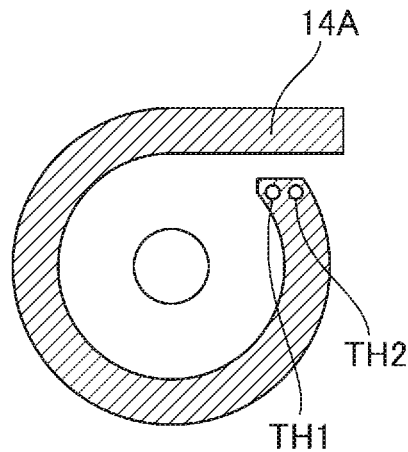
FIG. 7A is a view (view of a front face) illustrating Variant 2 of the conductor wire 14.

FIG. 7A is a view (view of a front face) illustrating Variant 2 of the conductor wire 14.

Figure 7B:
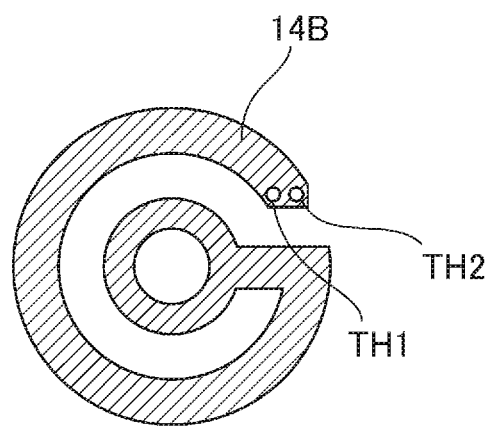
FIG. 7B is a view (view of a rear face) illustrating Variant 2 of the conductor wire 14.

FIG. 7B is a view (view of a rear face) illustrating Variant 2 of the conductor wire 14. FIG. 7B shows in detail the rear face which is viewed through the printed circuit board 11 from the front face of the printed circuit board.

The conductor wire 14 may be formed on both the front face and the rear face of a printed circuit board 11 having two layers, instead of the whole thereof being formed only on the front face of the printed circuit board 11 (illustrated in FIG. 2A). For example, a conductor wire 14A which is a half of the conductor wire 14 may be formed on the front face of the printed circuit board 11, as shown in FIG. 7A, and a conductor wire 14B which is the remaining half of the conductor wire 14 may be formed on the rear face of the printed circuit board 11, as shown in FIG. 7B. The conductor wire 14A and the conductor wire 14B are connected by, for example, through holes TH1 and TH2 penetrating the printed circuit board 11. Because of this, the flexibility in the sizes, shapes, positions and so on of electrical components and electronic components which should be disposed on the printed circuit board 11 can be improved, for example.

As an alternative, the conductor wire 14 may be formed on both the faces of a printed circuit board 11 having a multilayer (not illustrated) and between layers, instead of being formed on the printed circuit board 11 having two layers.

Figure 8A:
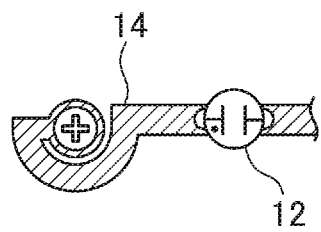
FIG. 8A is a view (view of approximately 180 degrees) illustrating Variant 3 of the conductor wire 14.

FIG. 8A is a view (view of approximately 180 degrees) illustrating Variant 3 of the conductor wire 14.

Figure 8B:
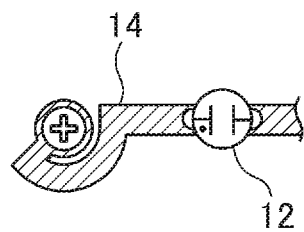
FIG. 8B is a view (view of approximately 135 degrees) illustrating Variant 3 of the conductor wire 14.

FIG. 8B is a view (view of approximately 135 degrees) illustrating Variant 3 of the conductor wire 14.

Figure 8C:
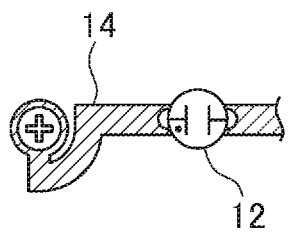
FIG. 8C is a view (view of approximately 90 degrees) illustrating Variant 3 of the conductor wire 14.

FIG. 8C is a view (view of approximately 90 degrees) illustrating Variant 3 of the conductor wire 14.

Instead of being formed along the virtual spiral shape KRK in such a way as to have a length corresponding to approximately 270 degrees (illustrated in FIG. 2A), the conductor wire 14 may be formed along a virtual spiral shape KRK in such a way as to have a length corresponding to approximately 180 degrees, as shown in FIG. 8A, may be formed along a virtual spiral shape KRK in such a way as to have a length corresponding to approximately 135 degrees, as shown in FIG. 8B, or may be formed along a virtual spiral shape KRK in such a way as to have a length corresponding to approximately 90 degrees, as shown in FIG. 8C.

In the conductor wire 14 of Variant 3 having the above-mentioned configuration, although the inductance of the conductor wire 14 is not increased to the extent that that of the conductor wire 14 having a length corresponding to approximately 270 degrees in Embodiment 1 is increased, the conductor wire 14 can be adjusted to an appropriate length, an appropriate shape, and so on from the viewpoint of the size of the space on the front face of the printed circuit board 11 and the size of the printed circuit board which is required to increase the inductance, for example.

The virtual spiral shape KRK in which the conductor wire 14 is wired may be oriented clockwise (illustrated in FIG. 8), instead of being oriented counterclockwise from an outer side to an inner side (illustrated in FIG. 2A).

The conductor wire 14 may be configured by selectively combining the above-mentioned configuration of winding a conductor wire several times (illustrated in FIG. 6), the above-mentioned configuration of forming a conductor wire on the faces and between layers (illustrated in FIG. 7, for example), and the above-mentioned configuration of forming a conductor wire along a part of a virtual spiral shape KRK (illustrated in FIG. 8).

<Variant of the Bar Member 13>

The bar member 13 may have any shape as long as the bar member has conductivity and magnetism, and, concretely, may be a nail, a square rod, a block, or the like, instead of being a screw.

The bar member 13 may have the same length as the part KK1 of the housing KT of the equipment KK or a length which exceeds the length of the part KK1, instead of having a length which is about half of the length of the part KK1.

<Variant of the Surge Absorber 12>

Instead of using an arrester as the surge absorber 12, another semiconductor element such as a varistor or both of them may be used.

The surge absorber 12 may be connected to a communication line such as a telephone line, instead of the first and second power source wires PL1 and PL2 for supplying power.

<Variant of the Equipment KK>

A spacer which is a member disposed separately from the equipment KK, instead of the part KK1 of the housing KT of the equipment KK, may be used.

The housing KT of the equipment KK may have magnetism in addition to conductivity.

The equipment KK may receive the supply of the power of a three phase alternating current or the power of a direct current, instead of receiving the supply of the power of the single-phase alternating current from the first and second power source wires PL1 and PL2.

Embodiment 2

Embodiment 2

Embodiment 2 of a surge protection circuit will be explained.

Configuration of Embodiment 2

Figure 9B:
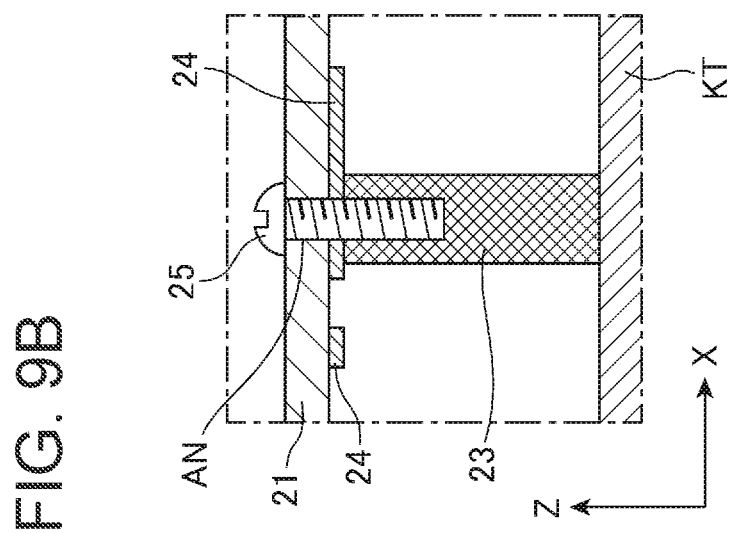
FIG. 9B is a cross-sectional view illustrating the configuration of the surge protection circuit 20 according to Embodiment 2.
Figure 9A:
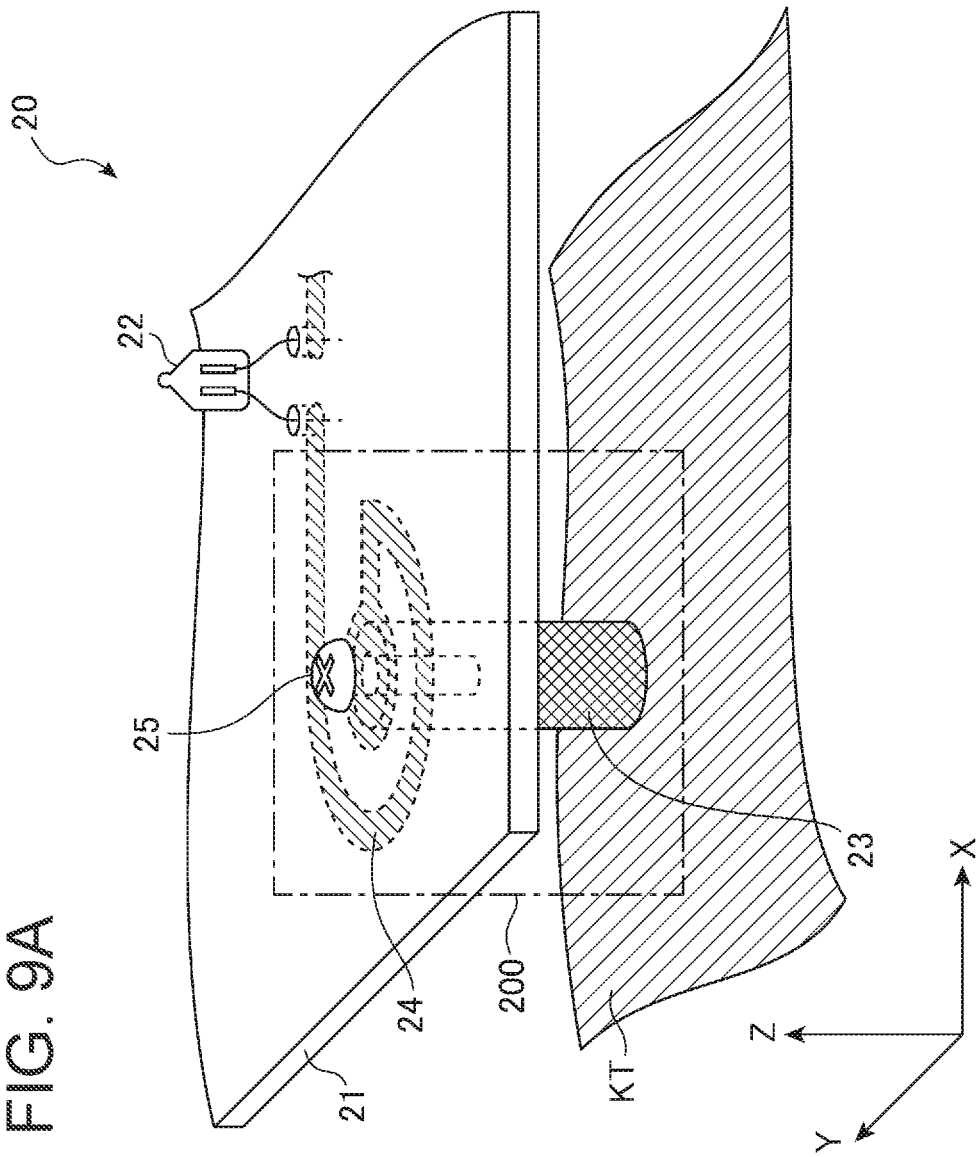
FIG. 9A is a perspective view about the configuration of a surge protection circuit 20 according to Embodiment 2.

FIG. 9A is a perspective view illustrating the configuration of a surge protection circuit 20 according to Embodiment 2.

FIG. 9B is a cross-sectional view illustrating the configuration of the surge protection circuit 20 according to Embodiment 2, taken along an XZ plane 200 of FIG. 9A.

The configuration of the surge protection circuit 20 according to Embodiment 2 will be explained by referring to FIGS. 9A and 9B.

The surge protection circuit 20 according to Embodiment 2 includes a printed circuit board 21, a surge absorber 22, a bar member 23, and a conductor wire 24, like the surge protection circuit 10 according to Embodiment 1 (illustrated in FIG. 2).

The configuration and the functions of the printed circuit board 21 and the surge absorber 22 according to Embodiment 2 are fundamentally the same as those of the printed circuit board 11 and the surge absorber 12 according to Embodiment 1.

While the bar member 23 of Embodiment 2 has conductivity and magnetism, like the bar member 13 of Embodiment 1, the bar member 23 is not a screw but a spacer, unlike the bar member 13 of Embodiment 1. The bar member 23 has a pillar shape or a tubular shape, for example. The bar member 23 is mechanically fixed to equipment KK (not illustrated). The bar member 23 is further screw-fastened with a screw 25 for mounting via a hole AN of the printed circuit board 21. Because of this, the printed circuit board 21 and a housing KT of the equipment KK are mechanically fixed to each other.

Here, the screw 25 for mounting has only to have the above-mentioned mechanical fixing mechanism. For this reason, the screw 25 for mounting does not have to have conductivity and magnetism, unlike the bar member 13 of Embodiment 1, i.e., a screw having conductivity and magnetism. Therefore, the screw 25 for mounting may be made of, for example, resin.

The conductor wire 24 of Embodiment 2 has an end connected to the surge absorber 22 and another end connected to the bar member 23, and is formed in such a way as to surround the bar member 23, like the conductor wire 14 of Embodiment 1.

On the other hand, the conductor wire 24 of Embodiment 2 is formed on a rear face of the printed circuit board 21, unlike the conductor wire 14 of Embodiment 1.

Because of the above-mentioned mechanical fixation between the bar member 23 and the equipment KK, and the above-mentioned screw fastening with the screw 25 for mounting via the hole AN of the printed circuit board 21, the conductor wire 24 formed on the rear face of the printed circuit board 21 is electrically connected to the bar member 23 and the housing KT of the equipment KK.

Operation of Embodiment 2

The operation of the surge protection circuit 20 according to Embodiment 2 is the same as that of the surge protection circuit 10 according to Embodiment 1 (illustrated in FIGS. 3 and 4).

Advantageous Effect of Embodiment 2

In the surge protection circuit 20 according to Embodiment 2, the conductor wire 24 formed on the rear face of the printed circuit board 21 is connected directly and electrically to the bar member 23, in more detail, the bar member 23 which has conductivity and magnetism and which is a spacer between the printed circuit board 21 and the equipment KK. Therefore, the screw 25 for mounting of Embodiment 2 does not have to have conductivity and magnetism, unlike the bar member 13 of Embodiment 1 which is a screw having conductivity and magnetism. Because of this, when, for example, selecting one type of screw 25 for mounting from among multiple types of candidates for the screw 25 for mounting, there is no necessity to take into consideration electrical characteristics such as conductivity and magnetism. As a result, one type of screw 25 for mounting can be selected more freely as compared to Embodiment 1, and can be selected in consideration of only mechanical characteristics and the workability of the mechanical assembly, for example.

<Variant>
<Variant of the Screw 25 for Mounting>

The screw 25 for mounting and the hole AN do not necessarily have to be used as long as the conductor wire 24 and the bar member 23 are electrically connected and the conductor wire 24 is disposed in such a way as to surround the bar member 23. For example, a portion of an upper face where the bar member 23 is in contact with the printed circuit board 21 may be formed into a convex shape, and this convex-shaped portion of the upper face may be used in order to position the bar member 23 to the printed circuit board 21. For example, the portion of the upper face where the bar member 23 is in contact with the printed circuit board 21 may be alternatively formed into a convex shape and threaded, and the printed circuit board 21 may be fixed by tightening a nut or the like to the convex-shaped and threaded portion of the upper face.

The screw 25 for mounting may have the same length as the bar member 23 or a length which exceeds the length of the bar member 23, instead of having a length which is about half of the length of the bar member 23.

<Variant of the Conductor Wire 24>

The conductor wire 24 may be wound several times (illustrated in FIG. 6), may be formed on both the faces of a printed circuit board 21 and between layers (illustrated in FIG. 7), may be formed along a virtual spiral shape KRK in such a way as to have a length corresponding to approximately 180 degrees, approximately 135 degrees, or approximately 90 degrees (illustrated in FIG. 8), or may be configured in such a way as to have a combination of these configurations, like a variant of the conductor wire 14 of Embodiment 1.

Embodiment 3

Embodiment 3

Embodiment 3 of a surge protection circuit will be explained.

Configuration of Embodiment 3

FIG. 10A is a perspective view illustrating the configuration of a surge protection circuit 30 according to Embodiment 3.

FIG. 10B is a cross-sectional view illustrating the configuration of the surge protection circuit 30 according to Embodiment 3, taken along an XZ plane 300 of FIG. 10A.

The configuration of the surge protection circuit 30 according to Embodiment 3 will be explained by referring to FIGS. 10A and 10B.

The surge protection circuit 30 according to Embodiment 3 includes a printed circuit board 31, a surge absorber 32, a frustum-shaped member 33 having a truncated cone shape, and a conductor wire 34, like the surge protection circuit 10 according to Embodiment 1 (illustrated in FIG. 2).

The configuration and the functions of the printed circuit board 31 and the surge absorber 32 of Embodiment 3 are fundamentally the same as the configuration and the functions of the printed circuit board 11 and the surge absorber 12 of Embodiment 1.

A housing KT of equipment KK+3 is made from a material having conductivity and magnetism, unlike the housing KT of the equipment KK of Embodiment 1.

The frustum-shaped member 33 is a part of the housing KT of the equipment KK, in detail, a portion in which a part of the housing KT of the equipment KK is formed into a trapezoidal shape or the like by means of press working or the like. In an upper face of the frustum-shaped member 33 is formed a hole AN2.

The printed circuit board 31 and the housing KT of the equipment KK are mechanically fixed to each other by means of screw fastening with a screw 35 for mounting via a hole AN of the printed circuit board 31 and the hole AN2 of the frustum-shaped member 33.

Here, because the screw 35 for mounting does not have to have conductivity and magnetism, like the screw 25 for mounting of Embodiment 2, the screw 35 for mounting is made from any material.

Operation of Embodiment 3

The operation of the surge protection circuit 30 according to Embodiment 3 is the same as that of the surge protection circuit 10 according to Embodiment 1 (illustrated in FIGS. 3 and 4).

Advantageous Effect of Embodiment 3

The surge protection circuit 30 according to Embodiment 3 has the frustum-shaped member 33 instead of the bar member 23 of Embodiment 2. The frustum-shaped member 33 is a part of the housing KT of the equipment KK, i.e., a part integral with the housing KT of the equipment KK, unlike the bar member 23 which is a spacer disposed separately from the housing KT of the equipment KK. Because of this, in the surge protection circuit 30 according to Embodiment 3, the number of parts to be mounted and the number of parts to be assembled can be reduced as compared with the surge protection circuit 20 according to Embodiment 2, for example.

<Variant>
<Variant of the Frustum-Shaped Member 33>

The frustum-shaped member 33 may be disposed by attaching the frustum-shaped member to the housing KT of the equipment KK by means of welding or electrically conductive adhesive, or by press fitting the frustum-shaped member to the housing KT, instead of being disposed by means of the above-mentioned forming such as press working.

<Variant of the Screw 35 for Mounting>

The screw 35 for mounting does not have to penetrate the frustum-shaped member 33, instead of penetrating the frustum-shaped member 33, as long as the screw for mounting can fix the printed circuit board 31 to the frustum-shaped member 33.

The screw 35 for mounting and the hole AN2 do not necessarily have to be used as long as the conductor wire 34 and the frustum-shaped member 33 are electrically connected and the conductor wire 34 is disposed in such a way as to surround the frustum-shaped member 33, like those of Embodiment 2. For example, by using a convex-shaped portion of the upper face of the frustum-shaped member 33 in order to position the frustum-shaped member 33 to the printed circuit board 31 or by tightening a nut or the like to a convex-shaped and threaded portion of the upper face of the frustum-shaped member 33, the printed circuit board 31 may be fixed, like in the case of Embodiment 2.

<Variant of the Conductor Wire 34>

The conductor wire 34 may be wound several times (illustrated in FIG. 6), may be formed on both the faces of a printed circuit board 21 and between layers (illustrated in FIG. 7), may be formed along a virtual spiral shape KRK in such a way as to have a length corresponding to approximately 180 degrees (illustrated in FIG. 8), or may be configured in such a way as to have a combination of these configurations, like a variant of the conductor wire 14 of Embodiment 1.

Embodiment 4

Embodiment 4

Embodiment 4 of a surge protection circuit will be explained.

Configuration of Embodiment 4

Figure 11B:
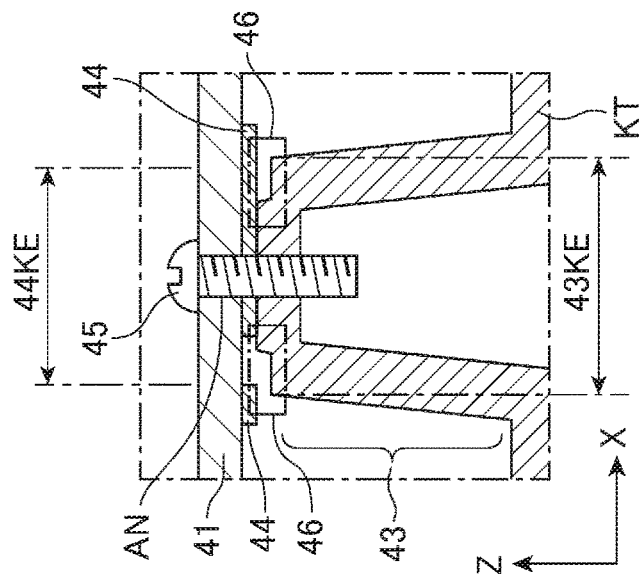
FIG. 11B is a cross-sectional view illustrating the configuration of the surge protection circuit 40 according to Embodiment 4.
Figure 11A:
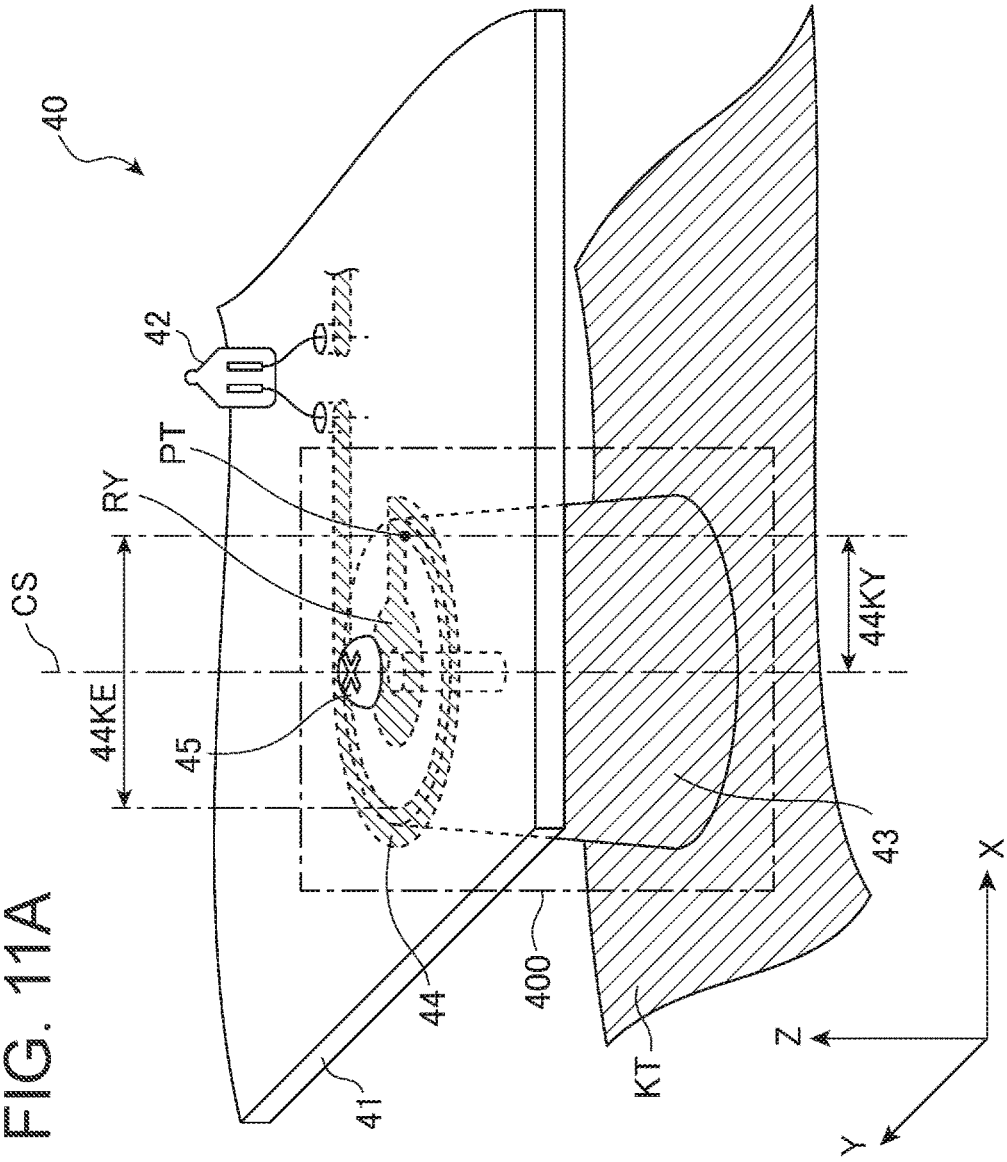
FIG. 11A is a perspective view illustrating the configuration of a surge protection circuit 40 according to Embodiment 4.

FIG. 11A is a perspective view illustrating the configuration of a surge protection circuit 40 according to Embodiment 4.

FIG. 11B is a cross-sectional view illustrating the configuration of the surge protection circuit 40 according to Embodiment 4, taken along an XZ plane 400 of FIG. 11A.

The configuration of the surge protection circuit 40 according to Embodiment 4 will be explained by referring to FIGS. 11A and 11B.

The surge protection circuit 40 according to Embodiment 4 includes a printed circuit board 41, a surge absorber 42, a frustum-shaped member 43, and a conductor wire 44, like the surge protection circuit 30 according to Embodiment 3 (illustrated in FIG. 10).

The frustum-shaped member 43 of Embodiment 4 differs from the frustum-shaped member 33 of Embodiment 3 in that the outer diameter 43KE of an upper face of the frustum-shaped member 43 is larger than the inner diameter 44KE of the conductor wire 44. The outer diameter 43KE of the upper face of the frustum-shaped member 43 is the diameter of the upper face of the frustum-shaped member 43 having a shape which is approximately a circle. The inner diameter 44KE of the conductor wire 44 is approximately twice as long as the distance 44KY in the conductor wire 44 between a point PT at which the conductor wire 44 spirally formed along a virtual spiral shape KRK is bent at approximately right angles toward a center line CS and the center line CS, as shown in FIG. 11A.

The outer diameter 43KE of the upper face of the frustum-shaped member 43 corresponds to "the diameter of an upper face of a member." The inner diameter 44KE of the conductor wire 44 corresponds to "the diameter of a virtual circle defined by at least a part of a virtual spiral shape of a conductor wire."

In the frustum-shaped member 43, a notch 46 is further formed as shown in FIG. 11B. The notch 46 has a shape for ensuring that, as a general rule, the frustum-shaped member 43 is not electrically connected to the whole of the conductor wire 44, as shown in FIG. 11B, while ensuring that, as an exception, the frustum-shaped member 43 is electrically connected only to a circular region RY, out of the conductor wire 44, which is a neighborhood of the screw 45 for mounting, as shown in FIG. 11A.

Operation of Embodiment 4

The operation of the surge protection circuit 40 according to Embodiment 4 is the same as that of the surge protection circuit 10 according to Embodiment 1 (illustrated in FIGS. 3 and 4).

Advantageous Effect of Embodiment 4

Figure 12:
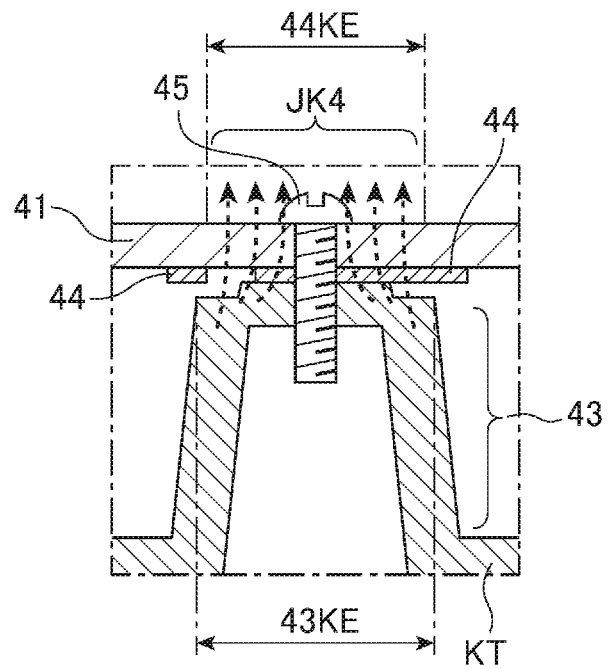
FIG. 12 is a cross-sectional view illustrating a magnetic field which is caused by the surge protection circuit 40 according to Embodiment 4.

FIG. 12 shows a magnetic field which is caused by the surge protection circuit according to Embodiment 4.

Figure 13:
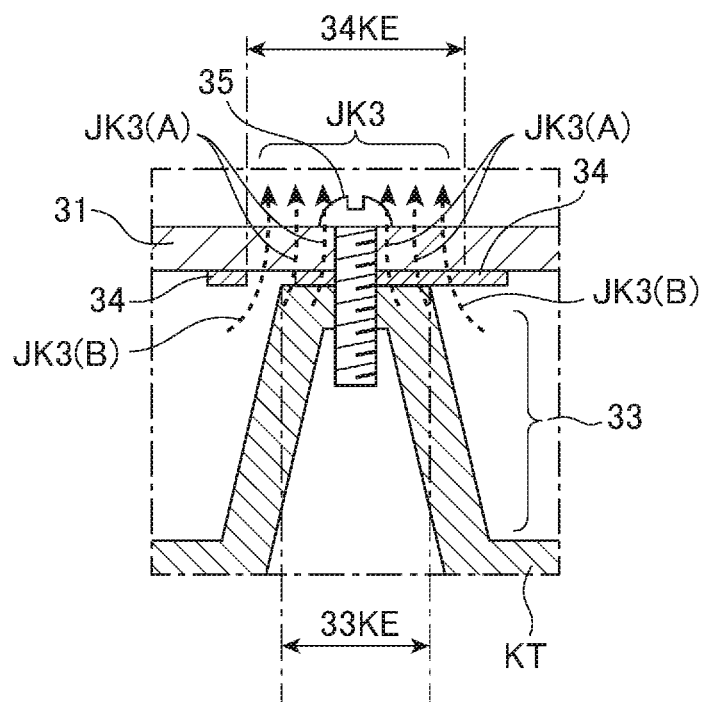
FIG. 13 is a cross-sectional view illustrating a magnetic field which is a comparative example and which is caused by the surge protection circuit 30 according to Embodiment 3.

FIG. 13 shows a magnetic field which is caused by the surge protection circuit according to Embodiment 3 which is a comparative example.

In the surge protection circuit 30 according to Embodiment 3 which is a comparative example, the outer diameter 33KE of the frustum-shaped member 33 is smaller than the inner diameter 34KE of the conductor wire 34, as shown in FIG. 13, in contrast to the surge protection circuit 40 according to Embodiment 4. Because of this, while a major part JK3(A) of a magnetic field JK3 which is caused by the flow of a surge current SC through the conductor wire 34 (illustrated in FIG. 3) passes through the upper face of the frustum-shaped member 33, a part JK3(B) of the magnetic field JK3 does not pass through the upper face of the frustum-shaped member 33.

In the surge protection circuit 40 according to Embodiment 4, the outer diameter 43KE of the frustum-shaped member 43 is larger than the inner diameter 44KE of the conductor wire 44 in contrast to the surge protection circuit 30 according to Embodiment 3, as mentioned above by referring to FIG. 12. Because of this, the whole of a magnetic field JK4 which is caused by the flow of a surge current SC through the conductor wire 44 passes through the upper face of the frustum-shaped member 43. Therefore, in the surge protection circuit 40 according to Embodiment 4, the inductance can be increased further compared to that in the surge protection circuit 30 according to Embodiment 3, and, as a result, a rapid variation of the surge current SC can be further prevented.

<Variant>
<Variant of the Notch 46>

In order to ensure the insulation between the conductor wire 44 and the frustum-shaped member 43, an insulating sheet member, instead of the above-mentioned notch 46, may be disposed between the conductor wire 44 and the frustum-shaped member 43.

In a case where, for example, the conductor wire 44 is formed on a front face of the printed circuit board 41 and between layers of the printed circuit board 41, instead of being formed on a rear face of the printed circuit board 41, the notch 46 does not have to be formed.

It is to be understood that embodiments mentioned above can be combined, and any component in each embodiment can be omitted or changed as appropriate or any component can be added without departing from the spirit and scope of the present disclosure.

INDUSTRIAL APPLICABILITY

The surge protection circuit according to the present disclosure can be used in, for example, surge protection systems that protect a semiconductor element for protecting circuits and elements from a lightning strike or the like from a rapid increase in a current, the rapid increase originating from the lightning strike or the like.

REFERENCE SIGNS LIST

10: Surge protection circuit, 11: Printed circuit board, 12: Surge absorber, 13: Bar member, 14: Conductor wire, 14A: Conductor wire, 14B: Conductor wire, 14X: Conductor wire, 20: Surge protection circuit, 21: Printed circuit board, 22: Surge absorber, 23: Bar member, 24: Conductor wire, 25: Screw for mounting, 30: Surge protection circuit, 31: Printed circuit board, 32: Surge absorber, 33: Frustum-shaped member, 33KE: Outer diameter, 34: Conductor wire, 34KE: Inner diameter, 35: Screw for mounting, 40: Surge protection circuit, 41: Printed circuit board, 42: Surge absorber, 43: Frustum-shaped member, 43KE: Outer diameter, 44: Conductor wire, 44KE: Inner diameter, 44KY: Distance, 45: Screw for mounting, 46: Notch, 100: XZ plane, 200: XZ plane, 300: XZ Plane, 400: XZ Plane, AN: Hole, AN2: Hole, CS: Center line, GL: Grounding electric potential, JK: Magnetic field, JK3: Magnetic field, JK4: Magnetic field, KK: Equipment, KK1: Part, KR: Circuit, KRK: Virtual spiral shape, KT: Housing, KTN: Point of intersection, PL1: First power source wire, PL2: Second power source wire, RY: Region, SC: Surge current, TH1: Through hole, TH2: Through hole, TN1: First terminal, TN2: Second terminal, and VR: Varistor.

The invention claimed is:

1. A surge protection circuit comprising:
    a printed circuit board;
    a surge absorber disposed on the printed circuit board;
    a member having conductivity and magnetism, and extending in a direction orthogonal to a face of the printed circuit board; and
    a conductor wire having an end connected to the surge absorber and another end connected to the member, formed in such a way as to extend from a point of intersection between a plane parallel to the face of the printed circuit board and a center line of the member in the orthogonal direction, which is a start point, and formed along at least a part of a virtual spiral shape centered at the point of intersection on the parallel plane, wherein
    the member has a truncated cone shape, and
    an upper face of the member has a diameter larger than that of a virtual circle defined by at least a part of the virtual spiral shape of the conductor wire.

2. The surge protection circuit according to claim 1, wherein the member has a cylindrical shape.

3. A surge protection method comprising:
    causing a magnetic field caused by a surge current flowing through a conductor wire connected to a surge absorber disposed on a printed circuit board, to pass through a member connected to the conductor wire, the conductor wire being formed in such a way as to extend from a point of intersection between a plane parallel to a face of the printed circuit board and a center line of the member in a direction orthogonal to the face of the printed circuit board, and along at least a part of a virtual spiral shape centered at the point of intersection on the parallel plane, the point of intersection being a start point, the member extending in the direction orthogonal to the face of the printed circuit board, and having conductivity and magnetism, wherein
    the member has a truncated cone shape, and
    an upper face of the member has a diameter larger than that of a virtual circle defined by at least a part of the virtual spiral shape of the conductor wire.

* * * * *